(12) United States Patent
Pohl et al.

(10) Patent No.: US 8,071,428 B2
(45) Date of Patent: Dec. 6, 2011

(54) SEMICONDUCTOR DEVICE

(75) Inventors: Jens Pohl, Bernhardswald (DE); Markus Brunnbauer, Lappersdorf (DE); Irmgard Escher-Poeppel, Regensburg (DE); Thorsten Meyer, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/388,140

(22) Filed: Feb. 18, 2009

(65) Prior Publication Data

US 2009/0155956 A1    Jun. 18, 2009

Related U.S. Application Data

(63) Continuation of application No. 11/772,539, filed on Jul. 2, 2007.

(51) Int. Cl.
*H01L 21/00* (2006.01)

(52) U.S. Cl. ........ 438/112; 438/110; 438/111; 438/113; 438/127; 438/68; 438/118

(58) Field of Classification Search .................. 438/107, 438/110, 111, 112, 113, 127, 124, 121, 584, 438/FOR. 340, FOR. 347, FOR. 369, 125, 438/126; 257/698, E23.011, E23.1, E23.116, 257/E23.123–E23.134, 685, 687, 678, E23.141–E23.178
See application file for complete search history.

(56) References Cited

U.S. PATENT DOCUMENTS

| | | | |
|---|---|---|---|
| 4,646,057 A | 2/1987 | Reynolds | |
| 5,646,067 A | 7/1997 | Gaul | |
| 5,897,337 A | 4/1999 | Kata et al. | |
| 6,180,881 B1 | 1/2001 | Isaak | |
| 6,486,415 B2 | 11/2002 | Jimarez et al. | |
| 6,614,104 B2 * | 9/2003 | Farnworth et al. | 257/686 |
| 6,822,324 B2 | 11/2004 | Tao et al. | |
| 6,860,004 B2 * | 3/2005 | Hirano et al. | 29/832 |
| 6,982,487 B2 | 1/2006 | Kim et al. | |
| 7,018,866 B2 * | 3/2006 | Sugaya et al. | 438/108 |
| 7,145,228 B2 | 12/2006 | Yean et al. | |
| 7,173,324 B2 | 2/2007 | Lee et al. | |
| 7,202,107 B2 | 4/2007 | Fuergut et al. | |
| 7,563,652 B2 * | 7/2009 | Yang et al. | 438/126 |
| 2001/0010627 A1 | 8/2001 | Akagawa | |
| 2003/0006494 A1 | 1/2003 | Lee et al. | |

(Continued)

FOREIGN PATENT DOCUMENTS

DE  248 907  8/1987

(Continued)

OTHER PUBLICATIONS

M. Brunnbauer et al., Embedded Wafer Level Ball Grid Array (eWLB), 2006 Electronics Packaging Technology Conference, 2006, pp. 1-5.

(Continued)

*Primary Examiner* — Marcos D Pizarro Crespo
*Assistant Examiner* — Diana C Vieira
(74) *Attorney, Agent, or Firm* — Dicke, Billig & Czaja, PLLC

(57) ABSTRACT

A semiconductor device and method. One embodiment provides an encapsulation plate defining a first main surface and a second main surface opposite to the first main surface. The encapsulation plate includes multiple semiconductor chips. An electrically conductive layer is applied to the first and second main surface of the encapsulation plate at the same time.

18 Claims, 12 Drawing Sheets

U.S. PATENT DOCUMENTS

| | | |
|---|---|---|
| 2004/0058472 A1 | 3/2004 | Shim |
| 2004/0160751 A1* | 8/2004 | Inagaki et al. ............... 361/763 |
| 2004/0178495 A1* | 9/2004 | Yean et al. .................... 257/723 |
| 2005/0287700 A1* | 12/2005 | Huang ......................... 438/106 |
| 2006/0024861 A1 | 2/2006 | Cordes et al. |
| 2006/0087044 A1 | 4/2006 | Goller |
| 2006/0094156 A1* | 5/2006 | Lai et al. ....................... 438/106 |
| 2006/0183269 A1* | 8/2006 | Fuergut et al. ............... 438/106 |
| 2006/0189124 A1 | 8/2006 | Beer et al. |
| 2006/0211233 A1 | 9/2006 | Gan et al. |
| 2007/0069389 A1* | 3/2007 | Wollanke et al. ............ 257/777 |
| 2008/0217167 A9* | 9/2008 | Hanson et al. ............... 204/242 |

FOREIGN PATENT DOCUMENTS

| | | |
|---|---|---|
| DE | 693 15 451 | 8/1993 |
| DE | 695 21 954 | 8/2001 |
| DE | 102 23 203 | 4/2004 |
| DE | 10 2004 013 770 | 5/2005 |
| DE | 10 2005 043 557 | 9/2006 |

OTHER PUBLICATIONS

Office Action mailed Nov. 22, 2010 in U.S. Appl. No. 11/772,539.

* cited by examiner

SEMICONDUCTOR DEVICE

CROSS-REFERENCE TO RELATED APPLICATIONS

This Utility patent application is a continuation of U.S. application Ser. No. 11/772,539, filed Jul. 2, 2007, which is incorporated herein by reference in its entirety.

BACKGROUND

This disclosure relates to semiconductor devices and methods to manufacture semiconductor devices.

For high system integration it is useful to stack integrated circuits, sensors, micromechanical apparatuses or other devices on top of each other. In order to be able to electrically connect the stacked devices, it may be useful for at least some of the stacked devices to be provided with electrical conductive feedthroughs from their top surface to their bottom surface.

For these and other reasons there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
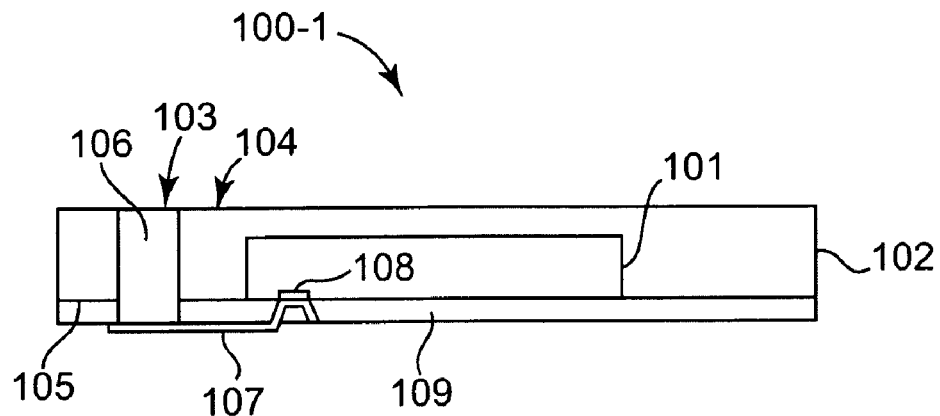
FIG. 1 schematically illustrates a device 100-1 as an exemplary embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In the following disclosure, embodiments of the invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of embodiments of the invention. It may be evident, however, to one skilled in the art that one or more aspects of the embodiments of the invention may be practiced with a lesser degree of these specific details. In other instances, known structures and devices are illustrated in block diagram form in order to facilitate describing one or more aspects of the embodiments of the invention. The following description is therefore not to be taken in a limiting sense, and the scope of the invention is defined by the appended claims.

Devices with a semiconductor chip embedded in a molding compound are described below. The semiconductor chips may be of extremely different types and may include for example integrated electrical or electro-optical circuits. The semiconductor chips may be configured as MEMS (micro-electro mechanical systems) and may include micro-mechanical structures, such as bridges, membranes or tongue structures. The semiconductor chips may be configured as sensors or actuators, for example pressure sensors, acceleration sensors, rotation sensors, microphones etc. Semiconductor chips in which such functional elements are embedded generally contain electronic circuits which serve for driving the functional elements or further process signals generated by the functional elements. The semiconductor chips need not be manufactured from specific semiconductor material and, furthermore, may contain inorganic and/or organic materials that are not semiconductors, such as for example insulators, plastics or metals.

The semiconductor chips may have contact pads which allow electrical contact to be made with the semiconductor chip. The contact pads may be composed of any desired electrical conductive material, for example of a metal, such as aluminum, gold or copper, a metal alloy or an electrical conductive organic material. The contact pads may be situated on the active surfaces of the semiconductor chips or on other surfaces of the semiconductor chips.

The devices described in the following include a molding compound layer covering at least parts of the semiconductor chips. The molding compound layer may be any appropriate thermoplastic or thermosetting material. Various techniques may be employed to cover the semiconductor chips with the molding compound layer, for example compression molding or injection molding. The molding compound may, for example, surround a main surface and side surfaces of the semiconductor chip. The molding compound layer may extend beyond the semiconductor chip so that the dimensions of a main surface of the molding compound layer may be larger than the dimensions of a main surface of the semiconductor chip.

A first electrically conductive layer may be applied to the molding compound layer. The first electrically conductive layer may be used to electrically couple contact pads of the semiconductor chips to external contacts. The first electrically conductive layer may be a redistribution layer or may be a part of it. The first electrically conductive layer may be manufactured with any desired geometric shape and any desired material composition. The first electrically conductive layer may, for example, be composed of linear conductor tracks, or may have special shapes, for example to form inductor coils, but may also be in the form of a layer covering an area. Any desired electrically conductive material, such as metals, for example aluminum, gold or copper, metal alloys or organic conductors, may be used as the material. The first electrically conductive layer need not be homogeneous or manufactured from just one material, that is to say various compositions and concentrations of the materials contained in the first electrically conductive layer are possible. The first electrically conductive layer may be arranged above or below or between dielectric layers. Furthermore, it can be provided that several first electrically conductive layers are stacked on top of each other, for example, in order to obtain conductor tracks crossing each other.

Through holes may be arranged in the molding compound layer, which may extend from one main surface of the molding compound layer to its other main surface or from one main surface of the device to its other main surface. The through holes may be generated by mechanical drilling, laser beam drilling, etching methods, stamping methods or any other appropriate method. The aspect ratio of the through holes, which is the ratio of their widths to their lengths, may be in the range from 1:1 to 1:5 and in particular from 1:2 to 1:4. The widths of the through holes may be in the range between 50 to 500 µm and in particular in the range between 100 and 200 µm. The lengths of the through holes may be in the range between 100 and 1000 µm and in particular in the range between 500 and 800 µm.

The molding compound layer may contain a filling material consisting of small particles of glass ($SiO_2$), or other electrically insulating mineral filler materials like $Al_2O_3$, or organic filler materials. The used grain size of the filling material may depend on the width of the through holes to be generated in the molding compound layer. For through holes with widths in the range of 100 µm or smaller a grain size of 10 µm or less may be used. For through holes with widths above 100 µm an average grain size of about 20 to 30 µm may be used.

The through holes may be lined with a second electrically conductive layer. For this layer, electrically conductive materials, such as metals, for example aluminum, gold or copper, metal alloys or organic conductors, may be used as the material. The second conductive layer may also consist of different single layers, for example a titanium or palladium based seed layer, a copper layer and a surface finish of nickel and gold. Other layer variations are possible. The second electrically conductive layer may have a thickness in the range between 0.2 and 75 µm and in particular in the range between 1 and 10 µm. The second electrically conductive layer deposited on the surfaces of the through holes forms a vertical contact that connects one main surface of the molding compound layer with its other main surface. After the generation of the second electrically conductive layer the through holes may be filled with a solder material or another electrically conductive material. The solder material may be made of metal alloys which are composed, for example, from the following materials: SnPb, SnAg, SnAgCu, SnAgCuNi, SnAu, SnCu and/or SnBi. The solder material may be lead-free. Alternatively, the through holes may not be coated with the second electrically conductive layer, but are filled with the solder material. According to yet another alternative, the through holes may be coated with the second electrically conductive layer, but are left unfilled or may be filled or coated with an electrically insulating material. For corrosion protection, the second electrically conductive layer may be coated with a corrosion resistant metal layer, such as a NiAu surface. Filling or coating the through holes with an appropriate material may help to protect the second electrically conductive layer against corrosion.

A third electrically conductive layer may be applied to the surface of the molding compound layer opposite the surface to which the first electrically conductive layer is applied. The third electrically conductive layer may be manufactured with any desired geometric shape and any desired material composition. The third electrically conductive layer may, for example, be composed of linear conductor tracks, or special shapes e.g., to form inductor coils, but may also be in the form of a layer covering an area. Any desired electrically conductive material, such as metals, for example aluminum, gold or copper, metal alloys or organic conductors, may be used as the material. The third electrically conductive layer may be in contact with the second electrically conductive layer and/or the solder material arranged in the through holes. The third electrically conductive layer may facilitate to contact the semiconductor chip from the top side of the device.

FIG. 1 schematically illustrates a device 100-1 according to an embodiment. A first semiconductor chip 101 is embedded in a molding compound layer 102. The molding compound layer 102 may extend beyond both sides of the larger extension of the semiconductor chip 101. A through hole 103 is located in the molding compound layer 102 and may extend from one main surface 104 of the molding compound layer 102 to its other main surface 105. The through hole 103 is filled with a solder material 106. A first electrically conductive layer 107 is applied to the molding compound layer 102. The first electrically conductive layer 107 may be implemented by one or more conductor tracks. The first electrically conductive layer 107 may electrically couple a contact pad 108 of the first semiconductor chip 101 to the solder material 106 arranged in the through hole 103. The surface of the first semiconductor chip 101 on which the contact pad 108 is situated may be the active main surface of the first semiconductor chip 101. A dielectric layer 109 may be provided between the active main surface of the first semiconductor chip 101 and the first electrically conductive layer 107. The dielectric layer 109 is opened at the position of the contact pad 108 to allow a connection between the contact pad 108 and the conductor track 107 to be made.

Figure 2:
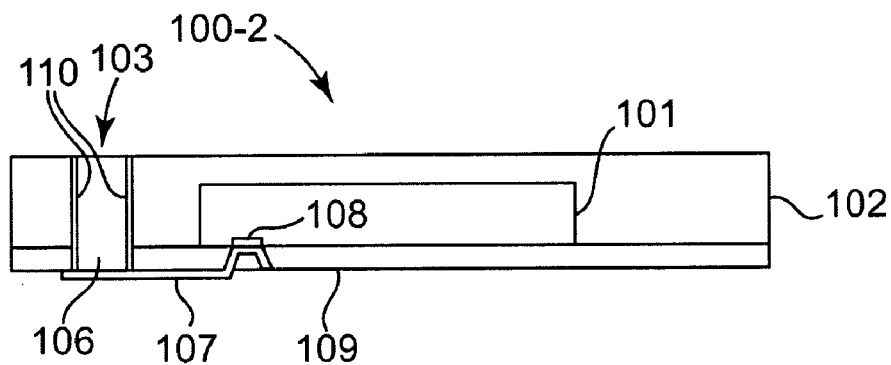
FIG. 2 schematically illustrates a device 100-2 as an exemplary embodiment.

FIG. 2 schematically illustrates a device 100-2 according to a further embodiment. The device 100-2 is in many ways identical to the device 100-1 illustrated in FIG. 1. However, in contrast to the device 100-1, the through hole 103 of the device 100-2 need not necessarily be filled with a solder material. Instead of the solder material, the through hole 103 may not be filled with a material or may be filled with another material, in particular an electrically insulating material. Furthermore, the surface of the through hole 103 is coated with a second electrically conductive layer 110. The first and second electrically conductive layers 107 and 110 may be connected to each other.

Figure 3:
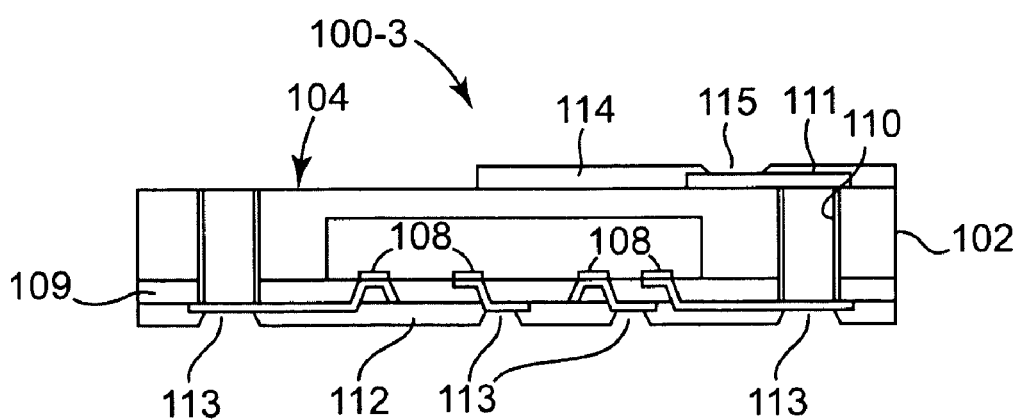
FIG. 3 schematically illustrates a device 100-3 as an exemplary embodiment.

FIG. 3 schematically illustrates a device 100-3 which is a development of the devices 100-1 and 100-2 illustrated in FIGS. 1 and 2. The device 100-3 is equipped with a third electrically conductive layer 111 which is arranged above the main surface 104 of the molding compound layer 102. The third electrically conductive layer 111 is electrically connected to the second electrically conductive layer 110 coating the surface of the through hole 103 and/or the material 106 deposited in the through hole 106. Furthermore, a dielectric layer 112 is applied to the conductor tracks 107. In the dielectric layer 112 openings are provided to form external contact pads 113 with the underlying conductor tracks 107. As an alternative to the external contact pads 113, contact rings or other shapes are possible. In the area of the electrically conductive feedthrough, the electrically conductive layers 107 and 111 may also be covered by a solder stop mask.

The first electrically conductive layer 107 together with the dielectric layers 109 and 112 form a redistribution layer. The dielectric layer 109 prevents short circuits of the conductor tracks 107 with the active main surface of the first semiconductor chip 101. The first electrically conductive layer 107 couples the contact pads 108 of the first semiconductor chip 101 to the external contact pads 113. The external contact pads 113 allow to contact the first semiconductor chip 101 from outside the device 100-3. The dielectric layer 112 protects the conductor tracks 107 and may be implemented as a solder stop layer in case solder deposits, for example solder balls, are placed on the external contact pads 113. It is to be noted that the number of layers of the redistribution layer is not limited to three. To facilitate a design where the conductor tracks 107 cross each other, further metallization layers and dielectric layers may be provided. Also, there may be a further dielectric layer arranged between the third electrically conductive layer 111 and the molding compound layer 102. Furthermore, the third electrically conductive layer 111 may also be protected by a dielectric layer 114. The dielectric layer 114 may also have openings to form external contact pads 115 on the top of the device 100-3. The external contact pads 115 may be electrically coupled to the contact pads 108 of the first semiconductor chip 101 via the second electrically conductive layer 110 coating the surface of the through holes 103 and/or the material 106, for example solder, deposited in the through holes 103. The dielectric layers 109, 112 and 114 may be manufactured from any electrically insulating material, for example, silicon nitride or photoresist.

It may be provided that the external contact pads 113 are not directly situated below the through holes 103, but may rather be shifted away from the through holes 103. This may prevent the solder material 106 deposited in the through holes 103 to leak from the through holes 103 when the solder deposited on the external contact pads 113 is melted.

The molding compound layer 102 allows the redistribution layers to extend beyond the first semiconductor chip 101. The external contact pads 113 and/or 115 therefore do not need to be arranged in the area of the first semiconductor chip 101 but can be distributed over a larger area. The increased area which is available for arrangement of the external contact pads 113 and 115 as a result of the molding compound layer 102 means that the external contact pads 113 and 115 cannot only be placed at a great distance from one another, but that the maximum number of external contact pads 113 and 115 which can be placed there is likewise increased compared to the situation when all the external contact pads 113 and 115 are placed within the area of the main surfaces of the first semiconductor chip 101. The distance between neighboring contact pads 113 and/or 115 may be in the range between 100 and 600 μm and in particular in the range between 300 and 500 μm.

Figure 4A:
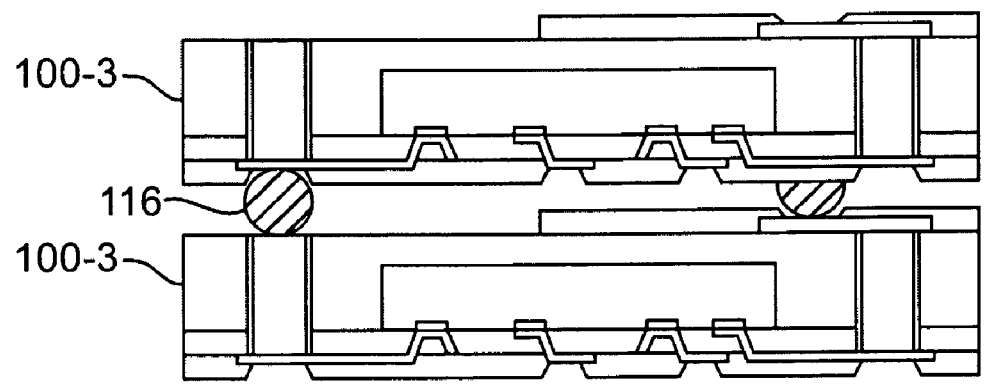
FIG. 4A schematically illustrates two stacked devices 100-3.

FIG. 4A schematically illustrates a device 100-3 stacked on top of another device 100-3. The external contact pads 113 of the top device 100-3 and the external contact pads 115 of the bottom device 100-3 are arranged such that they can be connected with each other by solder bumps or solder balls 116. Other variations of solder based interconnects like thin layers of solder material or semiballs (solder material in the shape of a spherical segment) may be arranged on the land pads. Such interconnects lead to a reduced stacking height. Also, other interconnection methods, like conductive glues, anisotropic conductive materials or diffusion solder materials may be used. Stacking devices on top of each other leads to a higher system integration. The vertical contacts in the through holes 103 of the molding compound layer 102 allow to produce short electrical connections between the devices stacked on top of each other. Furthermore, the vertical contacts in the through holes 103 may help to conduct and dissipate the heat generated by the semiconductor chips 101. It is obvious to a person skilled in the art that the stacked devices 100-3 illustrated in FIG. 4A are only intended to be an exemplary embodiment and many variations are possible. For example, other types of devices than the device 100-3 may be stacked on top of the device 100-3.

Figure 4B:
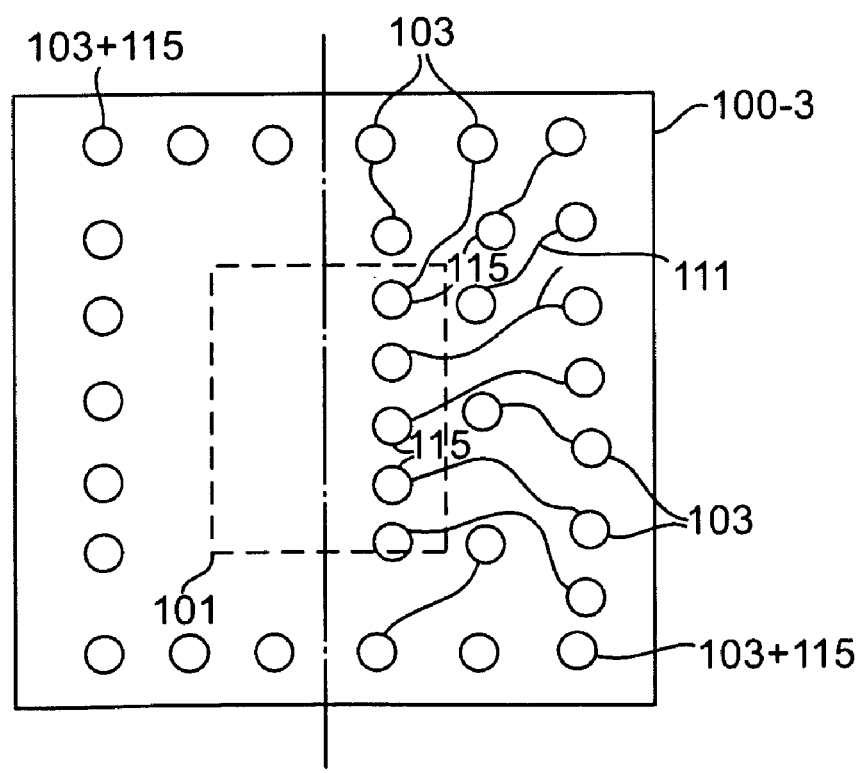
FIG. 4B schematically illustrates two different top views of the device 100-3.

FIG. 4B schematically illustrates two possible top views of the device 100-3. On the left hand side of FIG. 4B an embodiment of the device 100-3 is illustrated where the external contact pads 115 are arranged over the through holes 103. On the right hand side of FIG. 4B an embodiment of the device 100-3 is illustrated where at least some of the external contact pads 115 are not arranged over the through holes 103. The external contact pads 115 that are not arranged over the through holes 103 are coupled to the respective through holes 103 via the third electrically conductive layer 111. Some of the external contact pads 115 are arranged over the first semiconductor chip 101. The external contact pads 115 may form a full or depopulated land pad array on top of the device 100-3.

Figure 5A:
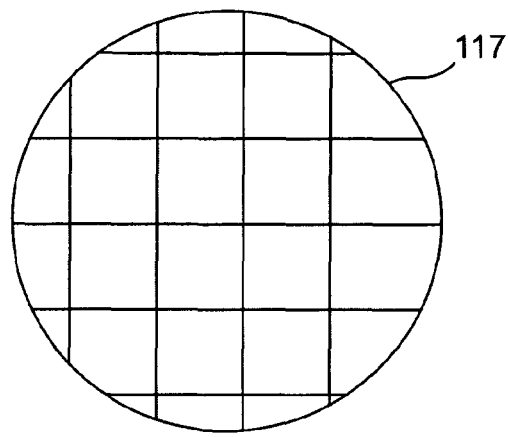
FIGS. 5A to 5L schematically illustrate a method to manufacture the device 100-3.
Figure 5B:
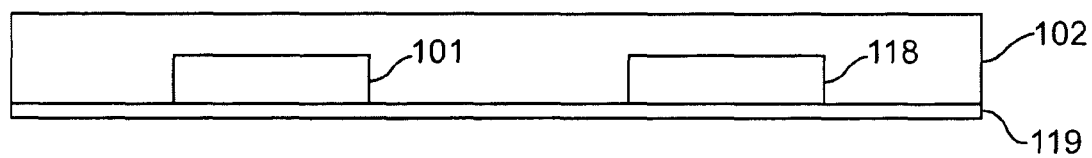
Figure 5C:
Figure 5D:
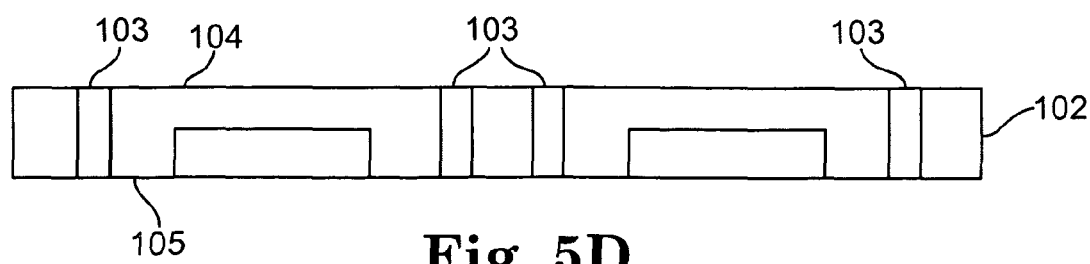
Figure 5E:
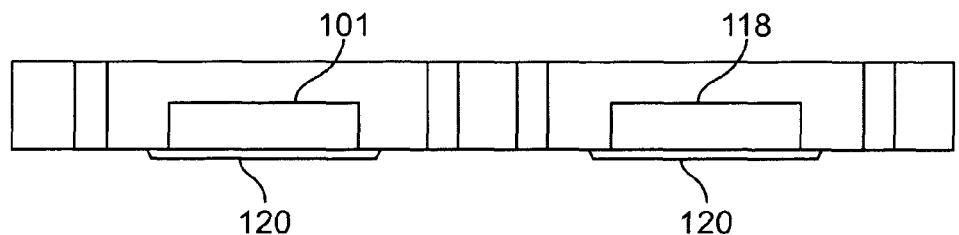
Figure 5F:
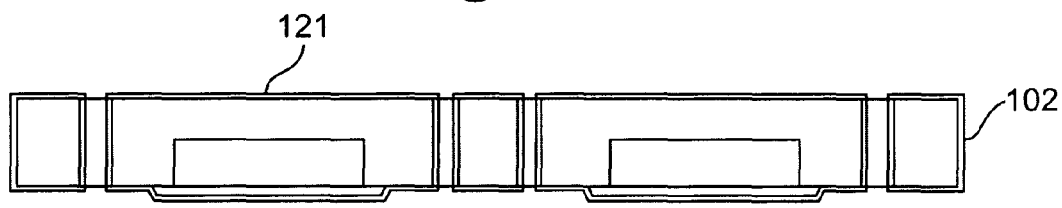
Figure 5G:
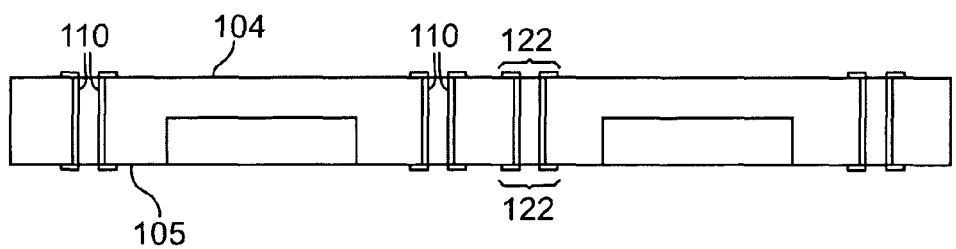
Figure 5H:
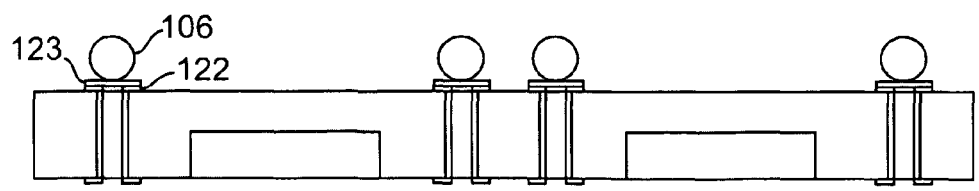
Figure 5I:
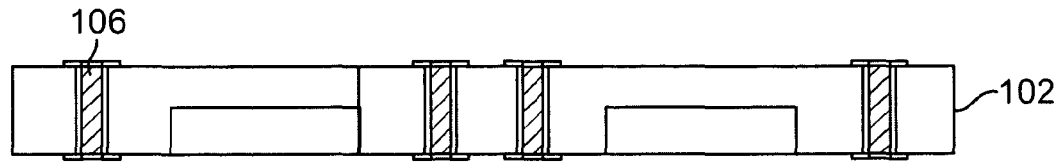
Figure 5J:
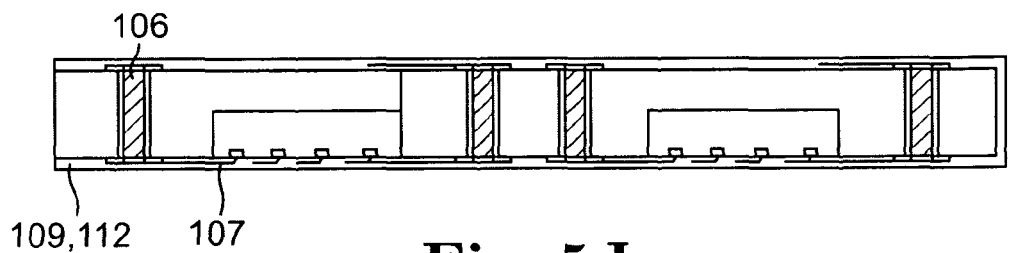
Figure 5K:
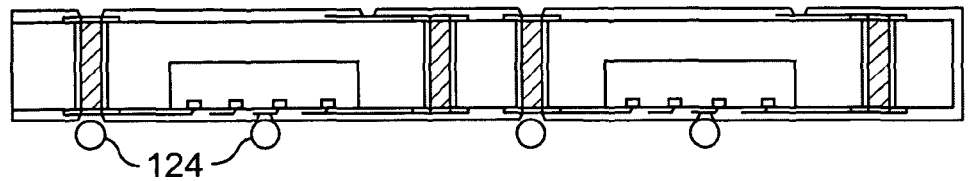
Figure 5L:
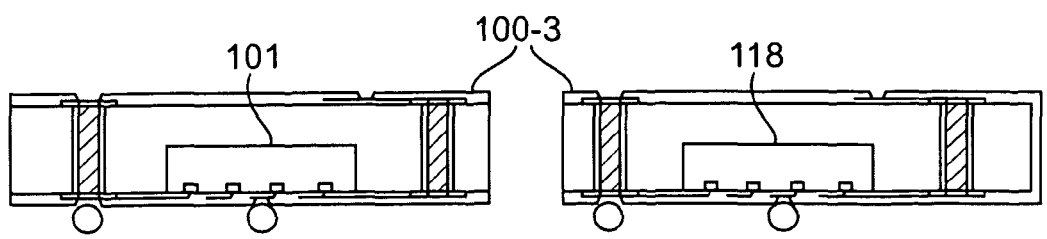
Figure 6A:
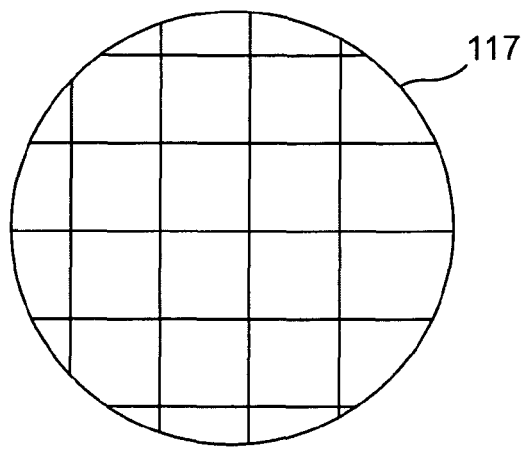
FIGS. 6A to 6K schematically illustrate a further method to manufacture the device 100-3.
Figure 6B:
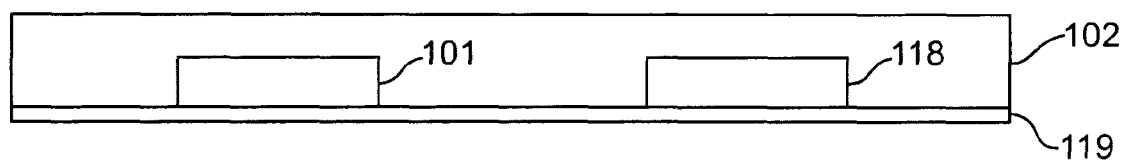
Figure 6C:
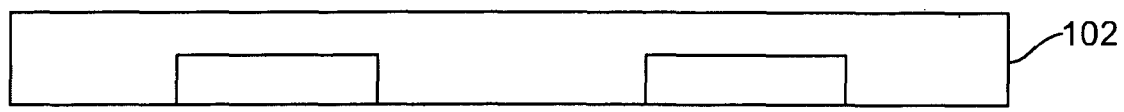
Figure 6D:
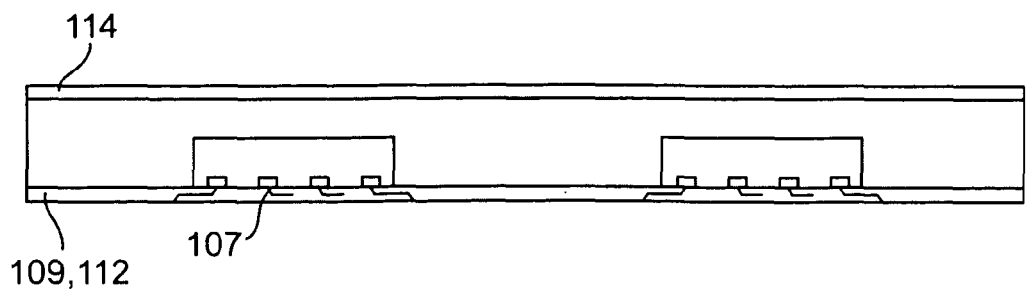
Figure 6E:
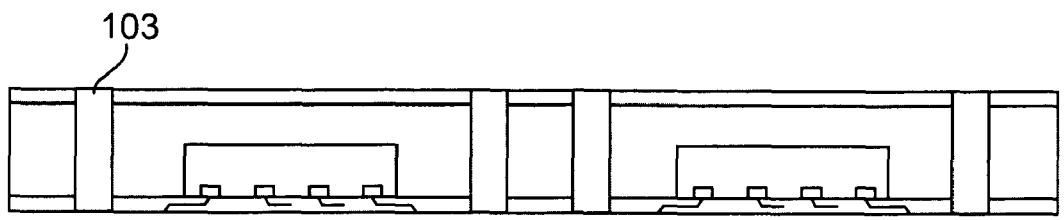
Figure 6F:
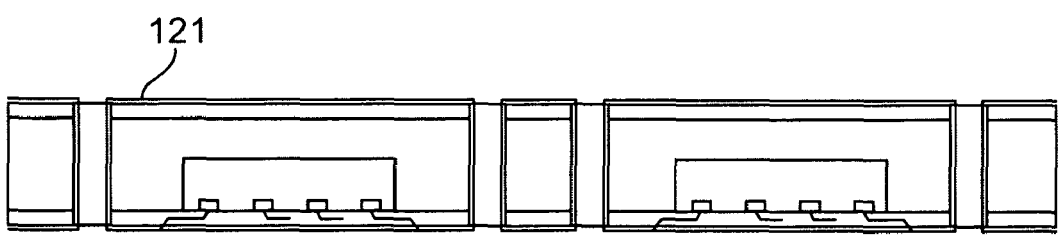
Figure 6G:
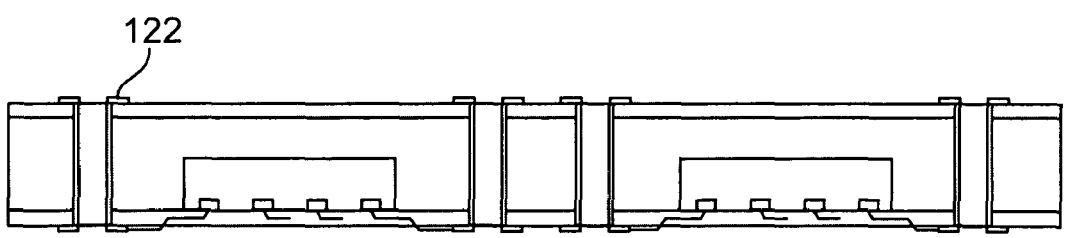
Figure 6H:
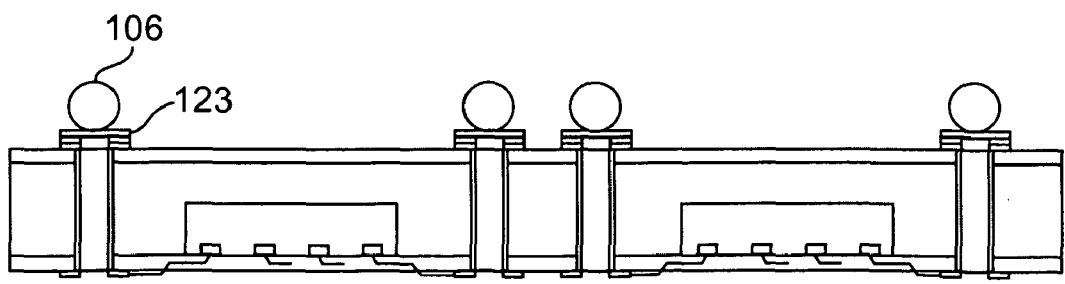
Figure 6I:
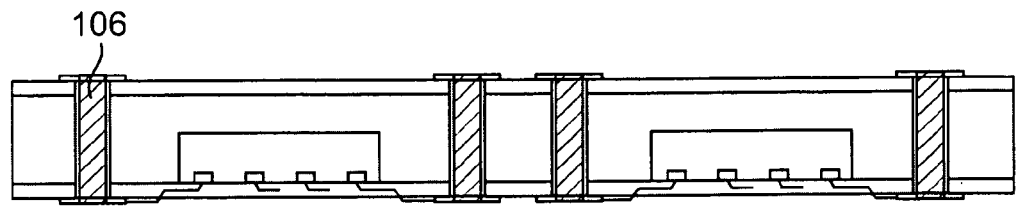
Figure 6J:
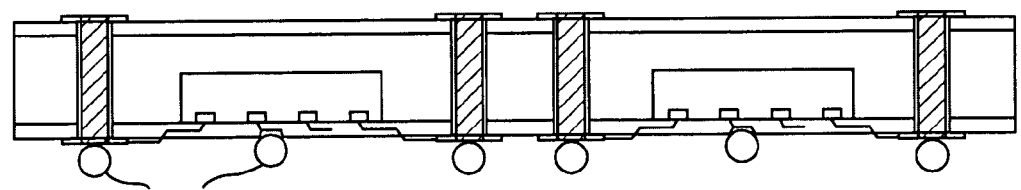
Figure 6K:
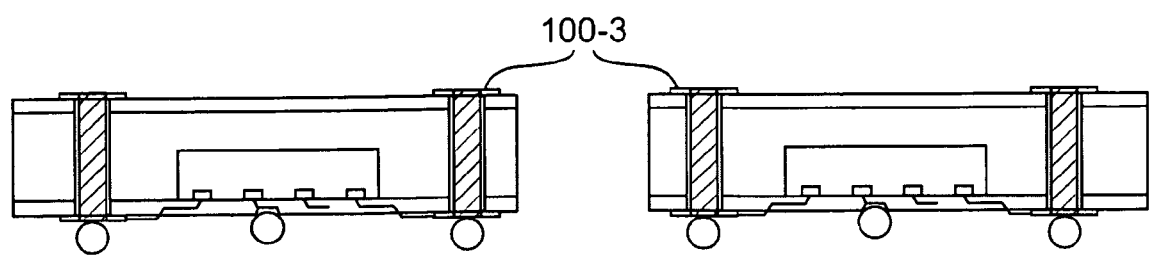
Figure 7A:
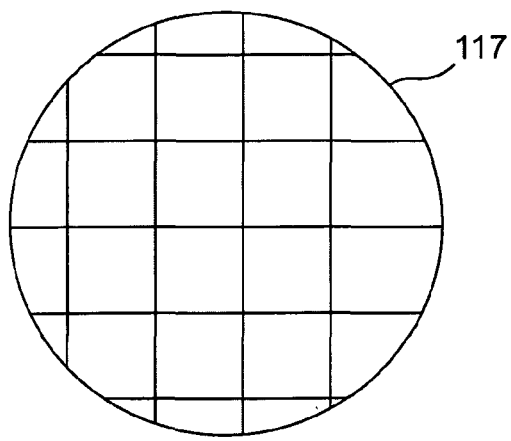
FIGS. 7A to 7J schematically illustrate yet a further method to manufacture the device 100-3.
Figure 7B:
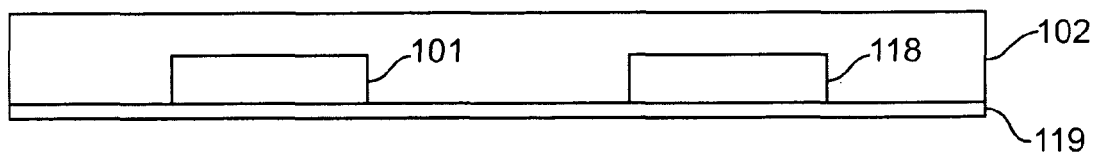
Figure 7C:
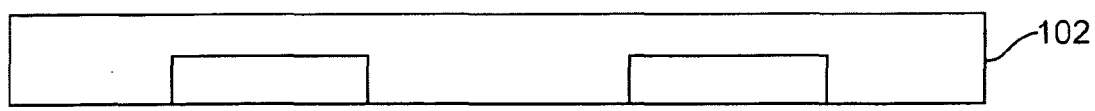
Figure 7D:
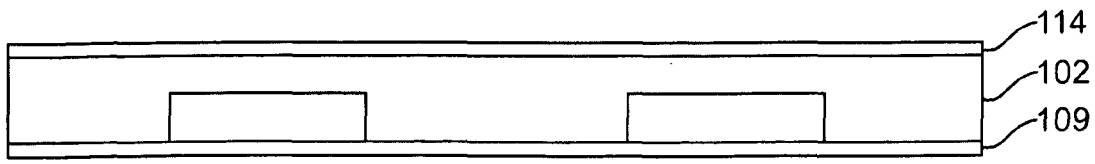
Figure 7E:
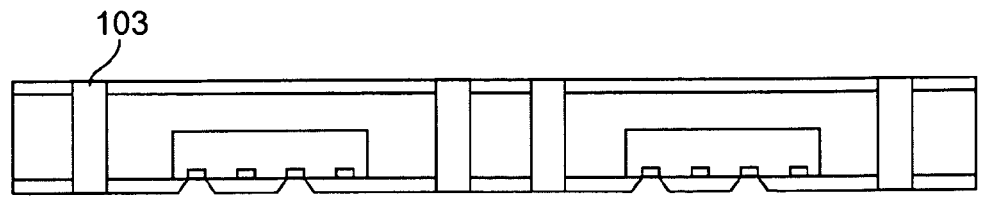
Figure 7F:
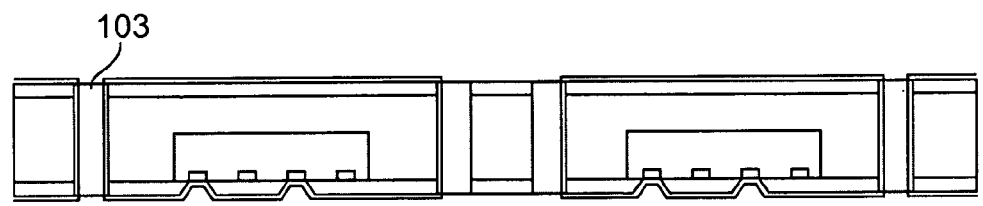
Figure 7G:
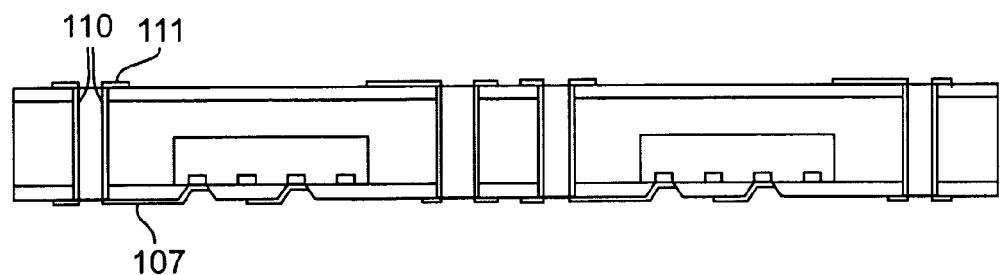
Figure 7H:
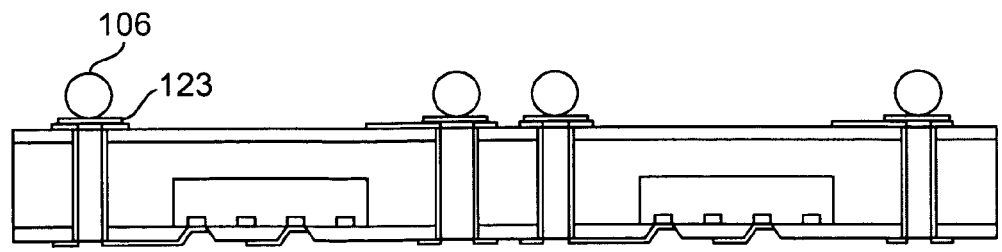
Figure 7I:
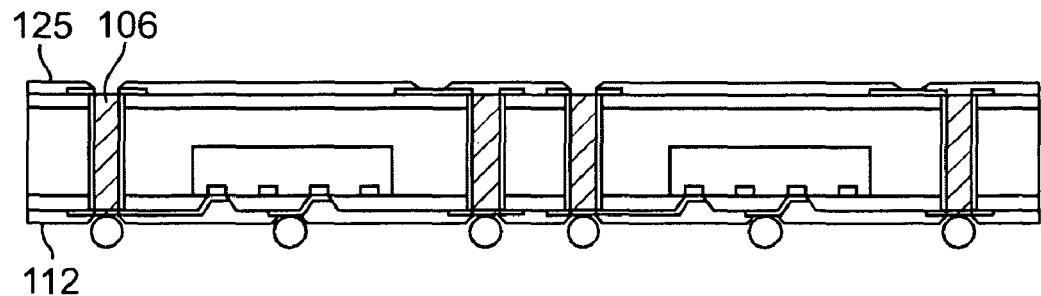
Figure 7J:
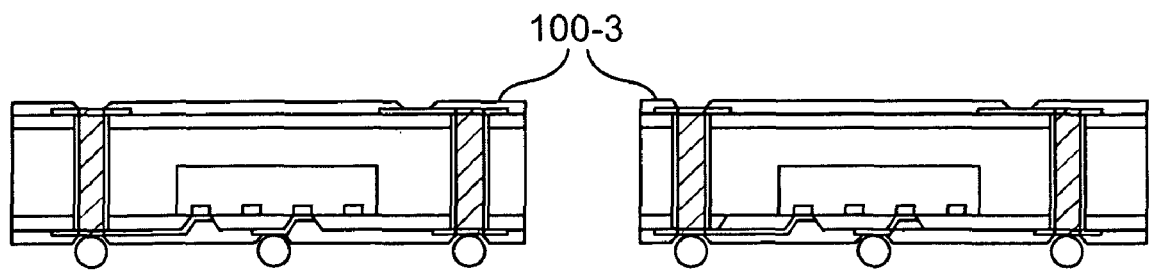

FIGS. 5A to 5L schematically illustrate a method for the production of a device 100-3, a cross section of which is illustrated in FIG. 5L. As illustrated in FIG. 5A, semiconductor chips which are used to fabricate the device 100-3 are fabricated on a wafer 117 made of semiconductor material. After dicing the wafer 117 and thereby separating the individual semiconductor chips, the first semiconductor chip 101 and a second semiconductor chip 118 are relocated on a carrier 119 in larger spacing as they have been in the wafer bond (see FIG. 5B). For the attachment of the semiconductor chips 101 and 118 to the carrier 119, a double-sided adhesive tape may, for example, be laminated onto the carrier 119 prior to the attachment of the semiconductor chips 101 and 118 (not illustrated in FIG. 5B). Other kinds of attaching materials may alternatively be used.

The semiconductor chips 101 and 118 may have been manufactured on the same wafer, but may alternatively have been manufactured on different wafers. Furthermore, the semiconductor chips 101 and 118 may be physically identical, but may also contain different integrated circuits. The active main surfaces of the semiconductor chips 101 and 118 may face the carrier 119 when attached to the carrier 119.

After the semiconductor chips 101 and 118 were mounted on the carrier 119, they are encapsulated by molding using a thermoplastic or thermosetting molding compound 102 (see FIG. 5B). The gaps between the semiconductor chips 101 and 118 are also are filled with the molding compound 102. The thickness of the molding compound layer 102 may be in the range from 200 to 800 μm.

The semiconductor chips 101 and 118 covered with the molding compound 102 are released from the carrier 119, and the adhesive tape is pealed from the semiconductor chips 101 and 118 as well as from the molding compound layer 102. The adhesive tape may feature thermo-release properties, which allow the removal of the adhesive tape during a heat-treatment. The removal of the adhesive tape from the carrier 119 is carried out at an appropriate temperature, which depends on the thermo-release properties of the adhesive tape and is usually higher than 150° C., in particular approximately 200° C. After removing the carrier 119, the semiconductor chips 101 and 118 are held together by the molding compound layer 102.

As illustrated in FIG. 5D, through holes 103 are formed in the molding compound layer 102. The through holes 103 reach from the top surface 104 of the molding compound layer 102 down to its bottom surface 105. The through holes 103 may be drilled using a laser beam, a mechanical drill, an etching method, a stamping method or any other appropriate method. When using a laser beam, the laser beam may have a conical geometry. Therefore the angle between the top surface 104 of the molding compound layer 102 and the side walls of the through holes 103 may deviate from 90°.

One or more cleaning steps may follow the formation of the through holes 103. For example, the molding compound layer 102 together with the semiconductor chips 101 and 118 may be dipped into an ultrasonic bath containing water and/or isopropanol.

Prior to the generation of the second electrically conductive layer 110, a masking layer 120 may be deposited onto the active main surfaces of the semiconductor chips 101 and 118 (see FIG. 5E). The masking layer 120 may, for example, be a layer of photoresist, silicon nitride or any other etching resist.

Thereafter the surface of the reconfigured wafer may be completely metallized with a metal layer 121 as illustrated in FIG. 5F. For that, a standard PCB (printed circuit board) through hole metallization process may be used. For example, a seed layer, such as a palladium layer, is first deposited onto the molding compound layer 102. Then a layer of copper is electroless deposited. This copper layer may have a thickness of less than 1 μm. Afterwards another layer of copper is galvanically deposited, which may have a thickness of more than 5 μm. The electroless copper deposition may also be omitted.

The metal layer 121 may be structured in order to generate the desired metallic structures using lithographic and etching steps. As a result the second electrically conductive layers 110 are obtained coating the surfaces of the through holes 103 (see FIG. 5G). The second electrically conductive layers 110 may also overlap the main surfaces 104 and 105 of the molding compound layer 102 in regions next to the through holes 103 forming land pads 122.

It may be provided that an electrically insulating material, such as epoxy, is filled into the through holes 103 coated with the second electrically conductive layer 110. It may alternatively be provided that the coated through holes 103 are coated with a further layer, such as a nickel gold layer, and that the remaining parts of the through holes 103 are left unfilled. Both, the electrically insulating material as well as the further layer, may protect the second electrically conductive layer 110 against corrosion.

According to a further embodiment, the though holes 103 are filled with a solder material 106. For that, a flux material 123 together with the solder material 106 may be placed on the land pads 122 (see FIG. 5H).

The flux material 123 may be printed on the land pads 122. A stencil may be placed over the molding compound layer 102 and the flux material 123 may be pressed through the stencil with a squeegee. The solder material 106 may be printed onto the flux material 123. Alternatively, a pick and place process or a shacking process may be used to place the solder material 106 in the form of solder balls on the land pads 122. The solder material 106 may be a lead-free metal alloy, such as SnPb, SnAg, SnAgCu, SnAgCuNi, SnAu, SnCu or SnBi. The flux material 123 may, for example, be a no-clean flux, which evaporates during the soldering process.

The flux material 123 and the solder material 106 are heated up above the melting temperature of the solder material 106, for example to temperatures in the range between 160° C. and 300° C. and in particular in the range between 180° C. and 260° C. The melted solder material 106 then flows into the through holes 103 and solidifies there (see FIG. 5I).

The redistribution layers including the electrically conductive layers 107 and 115 as well as the dielectric layers 109, 112 and 114 may be generated using standard techniques (see FIG. 5J). For example, silicon nitride may be sputtered on the main surfaces 104 and 105 of the molding compound layer 102 for the dielectric layers 109, 112 and 114. The electrically conductive layers 107 and 115 may be manufactured by metallization and structuring steps, for example in subtractive or alternatively in additive processes. The electrically conductive layers 107 and 115 are arranged such that they are in contact with the solder material 106 and/or the second electrically conductive layers 110 coating the surfaces of the through holes 103.

The dielectric layers 112 and 114 are opened at the positions of the external contact pads 113 and 115. Solder balls 124 may be placed on the external contacts pads 113 and/or 115 (see FIG. 5K). Before or after the placement of the solder balls 124, the semiconductor chips 101 and 118 are separated from each other by separation of the molding compound layer 102, for example by sawing (see FIG. 5L).

FIGS. 6A to 6K schematically illustrate a further method for the production of the device 100-3. The production method illustrated in FIGS. 6A to 6K is in many ways identical to the production method illustrated in FIGS. 5A to 5L (see for example FIGS. 6A to 6C). In contrast to the production method of FIGS. 5A to 5L, the redistribution layers including the electrically conductive layers 107 and 115 as well as the dielectric layers 109, 112 and 114 are deposited on the molding compound layer 102 (see FIG. 6D) before the through holes 103 are generated (see FIG. 6E) and the first electrically conductive layers 110 coating the surfaces of the through holes 103 are generated (see FIGS. 6F and 6G).

FIGS. 7A to 7J schematically illustrate a further variation of the method for the production of the device 100-3. In contrast to the production method according to FIGS. 5A to 5L, the dielectric layers 109 and 114 are deposited on the molding compound layer 102 (see FIG. 7D) before the generation of the through holes 103 (see FIG. 7E). After the generation of the through holes 103, the metal layer 121 is deposited (see FIG. 7F) and structured (see FIG. 7G). By doing so, the electrically conductive layers 107, 110 and 111 are generated at the same time. The three electrically conductive layers 107, 110 and 111 may be generated by electroless deposition of a seed layer, electroless deposition of a thin and continuous copper layer and galvanic deposition of another metal layer. Furthermore, it is to be noted that the dielectric layers 109 and 114 can also be omitted.

After the generation of the electrically conductive layers 107, 110 and 111, further dielectric layers 112 and 125 may be deposited (see FIG. 7I) and the solder material 106 may be filled into the through holes 106 as described above (see FIG. 7H).

Figure 8A:
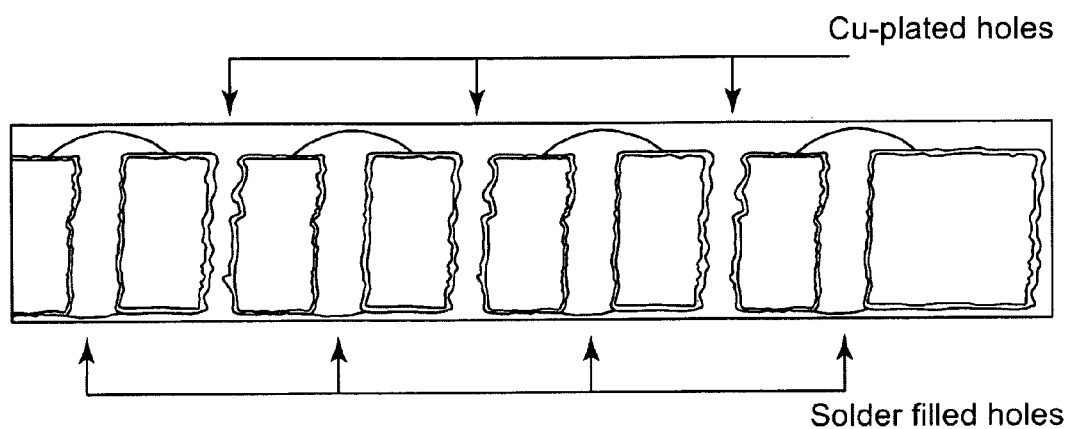
FIGS. 8A to 8C illustrate diagrams of cross-sections through a molding compound layer with conductive through hole contacts as an exemplary embodiment.
Figure 8B:
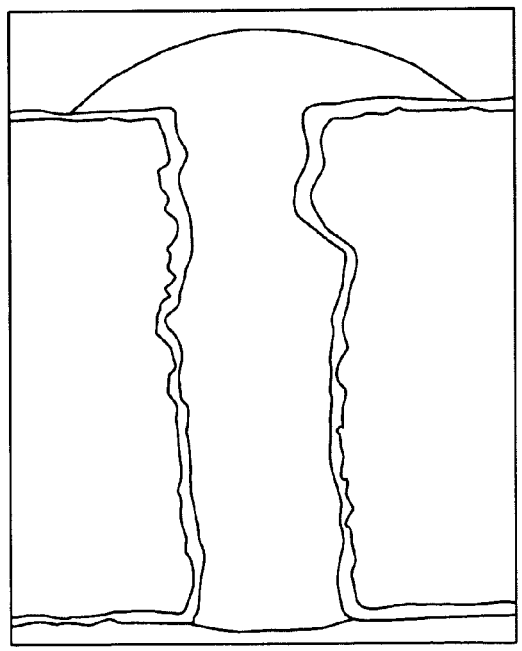
Figure 8C:
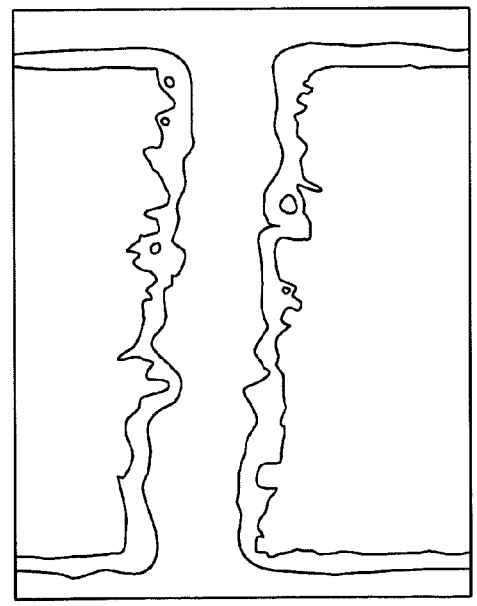

FIGS. 8A to 8C illustrate diagrams of cross-sections through a molding compound layer, in which through holes are arranged. All through holes are coated with a copper layer, some of the through holes are filled with solder material.

In addition, while a particular feature or aspect of an embodiment of the invention may have been disclosed with respect to only one of several implementations, such feature or aspect may be combined with one or more other features or aspects of the other implementations as may be desired and for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
    producing an encapsulation plate by placing multiple semiconductor chips on a carrier, with active sides of the semiconductor chips facing the carrier, and covering the multiple semiconductor chips and a surface of the carrier on which the multiple semiconductor chips are placed with a molding compound, the encapsulation plate defining a first main surface and a second main surface opposite to the first main surface, and the semiconductor chips comprising semiconductor material and integrated circuits integrated into the semiconductor material;
    removing the carrier to expose one of the first main surface and second main surface of the encapsulation plate including the active surfaces of the multiple semiconductor chips;
    applying a masking layer over at least the active surfaces of the multiple semiconductor chips;
    applying an electrically conductive layer to the first and second main surfaces of the encapsulation plate at the same time, including a portion on the masking layer; and
    removing the masking layer, including the portion of the electrically conductive layer on the masking layer.

2. The method of claim 1, comprising applying a dielectric layer to at least one of the first and second main surface of the encapsulation plate before applying the electrically conductive layer.

3. The method of claim 2, comprising structuring the dielectric layer before applying the electrically conductive layer.

4. The method of claim 3, comprising structuring the dielectric layer in order to expose contact pads of the multiple semiconductor chips.

5. The method of claim 1, comprising separating the multiple semiconductor chips by dividing the encapsulation plate.

6. The method of claim 1, wherein the multiple semiconductor chips comprise active surfaces and exposing the active surfaces from the encapsulation plate.

7. The method of claim 1, comprising structuring the electrically conductive layer.

8. The method of claim 1, wherein the application of the electrically conductive layer comprises depositing a seed layer.

9. The method of claim 8, comprising electrolessly depositing the seed layer.

10. The method of claim 8, wherein the application of the electrically conductive layer comprises electroless depositing a copper layer on the seed layer.

11. The method of claim 1, wherein the application of the electrically conductive layer comprises galvanically depositing a metal layer.

12. The method of claim 11, comprising galvanically depositing the metal layer on a seed layer.

13. The method of claim 1, comprising forming at least one through hole in the encapsulation plate extending from the first main surface to the second main surface of the encapsulation plate.

14. The method of claim 13, comprising applying the electrically conductive layer to the at least one through hole and the first and second main surface of the encapsulation plate at the same time.

15. The method of claim 14, comprising filling the at least one through hole with an electrically conductive material after applying the electrically conductive layer to the at least one through hole.

16. The method of claim 14, comprising filling the at least one through hole with an electrically insulating material after applying the electrically conductive layer to the at least one through hole.

17. A method, comprising:
    placing a semiconductor chip on a carrier, wherein an active surface of the semiconductor chip faces the carrier;
    covering the semiconductor chip with a molding compound;
    removing the carrier to expose a first major surface formed by a surface of the molding material and the active surface of the semiconductor;
    applying a mask layer over at least the active surface of the semiconductor chip
    forming a through hole in the molding compound;
    generating a first electrically conductive layer on the surface of the molding compound and including a portion on the masking layer;
    generating a second electrically conductive layer on a surface of the through hole, wherein generating the first and second electrically conductive layers is performed simultaneously; and
    removing the masking layer and the portion of the first electrically conductive layer on the masking layer.

18. The method of claim 17, comprising depositing a metal layer on the molding compound and generating the first and second electrically conductive layers by structuring the metal layer.

* * * * *